United States Patent
Nakagawa et al.

(10) Patent No.: US 9,953,577 B2
(45) Date of Patent: Apr. 24, 2018

(54) GATE DRIVE INTEGRATED CIRCUIT USED IN IMAGE DISPLAY DEVICE, IMAGE DISPLAY DEVICE, AND ORGANIC EL DISPLAY

(71) Applicant: JOLED INC., Tokyo (JP)

(72) Inventors: Hirofumi Nakagawa, Tokyo (JP); Hiroshi Takahara, Osaka (JP)

(73) Assignee: JOLED INC., Tokyo (JP)

( * ) Notice: Subject to any disclaimer, the term of this patent is extended or adjusted under 35 U.S.C. 154(b) by 190 days.

(21) Appl. No.: 15/101,962

(22) PCT Filed: Apr. 10, 2014

(86) PCT No.: PCT/JP2014/002069
§ 371 (c)(1),
(2) Date: Jun. 6, 2016

(87) PCT Pub. No.: WO2015/087460
PCT Pub. Date: Jun. 18, 2015

(65) Prior Publication Data
US 2016/0307513 A1    Oct. 20, 2016

(30) Foreign Application Priority Data
Dec. 9, 2013   (JP) .................. 2013-254556

(51) Int. Cl.
*G09G 3/30*      (2006.01)
*G09G 3/3258*    (2016.01)
(Continued)

(52) U.S. Cl.
CPC ......... *G09G 3/3258* (2013.01); *G09G 3/3266* (2013.01); *G09G 2310/0283* (2013.01);
(Continued)

(58) Field of Classification Search
CPC ............. G09G 3/3258; G09G 3/3266; G09G 2310/08; G09G 2310/0283; G09G 2310/0286; G09G 2310/0291
See application file for complete search history.

(56) References Cited

U.S. PATENT DOCUMENTS

| 6,618,111 B1 | 9/2003 | Nagata et al. |
| 7,106,292 B2 | 9/2006 | Moon |

(Continued)

FOREIGN PATENT DOCUMENTS

| JP | 05-035219 | 2/1993 |
| JP | 2001-188246 | 7/2001 |

(Continued)

OTHER PUBLICATIONS

International Search Report, dated Jul. 15, 2014, from the Japan Patent Office in the corresponding International Application No. PCT/JP2014/002069.

*Primary Examiner* — Vijay Shankar
(74) *Attorney, Agent, or Firm* — Greenblum & Bernstein, P.L.C.

(57) ABSTRACT

A gate drive integrated circuit includes: clock terminals; a bidirectional buffer that is located between the clock terminals and controls the input-output direction of a clock signal; a connection mode control terminal that receives a connection mode control signal; and a pair of signal direction control terminals that receive a signal direction control signal, wherein the bidirectional buffer fixes the input-output direction of the clock signal to one direction in the case where the logic state of the connection mode control signal is a first logic state, and switches the input-output direction of the clock signal depending on the logic state of the signal direction control signal in the case where the logic state of (Continued)

the connection mode control signal is a second logic state different from the first logic state.

10 Claims, 11 Drawing Sheets

(51) Int. Cl.
    *G09G 3/3266*     (2016.01)
    *H01L 27/32*     (2006.01)
    *G11C 19/28*     (2006.01)

(52) U.S. Cl.
    CPC ............ *G09G 2310/0286* (2013.01); *G09G 2310/0291* (2013.01); *G09G 2310/08* (2013.01); *G11C 19/28* (2013.01); *H01L 27/3244* (2013.01)

(56) References Cited

U.S. PATENT DOCUMENTS

| | | | |
|---|---|---|---|
| 7,199,779 | B2 | 4/2007 | Toriumi et al. |
| 7,701,433 | B2 | 4/2010 | Iida et al. |
| 7,830,489 | B2 | 11/2010 | Kim |
| 8,866,724 | B2 | 10/2014 | Moon |
| 9,208,708 | B2* | 12/2015 | Kitadani ................ G09G 3/001 |
| 9,495,914 | B2* | 11/2016 | Kitadani ................ G09G 3/001 |
| 9,679,521 | B2* | 6/2017 | Kitadani ................ G09G 3/001 |
| 2003/0227433 | A1 | 12/2003 | Moon |
| 2004/0239659 | A1 | 12/2004 | Toriumi et al. |
| 2006/0233003 | A1 | 10/2006 | Iwanaga et al. |
| 2006/0256066 | A1 | 11/2006 | Moon |
| 2007/0063960 | A1 | 3/2007 | Iida et al. |
| 2007/0167036 | A1 | 7/2007 | Kim |
| 2017/0278483 | A1* | 9/2017 | Miyazawa ................ G09G 5/10 |
| 2018/0033353 | A1* | 2/2018 | Kim ........................ G09G 3/006 |

FOREIGN PATENT DOCUMENTS

| | | |
|---|---|---|
| JP | 2002-175037 | 6/2002 |
| JP | 2004-279467 | 10/2004 |
| JP | 2006-285141 | 10/2006 |
| JP | 2007-072062 | 3/2007 |
| JP | 2007-188078 | 7/2007 |
| JP | 2007-264368 | 10/2007 |
| JP | 2009-272037 | 11/2009 |

* cited by examiner

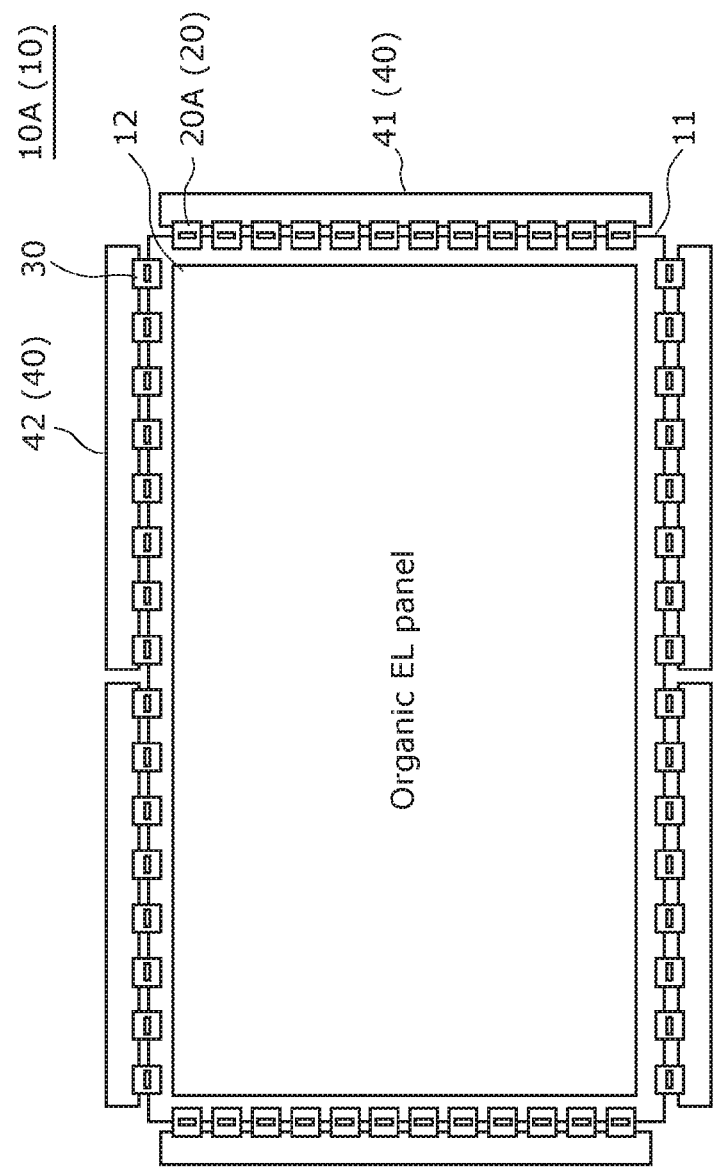

FIG. 6

| CLKSEL | Input-output direction of signal | Connection mode |
|---|---|---|
| L | CLKnA → CLKnB (n = 1 to 4) | Multidrop connection mode |
| H | According to setting of DIR in FIG. 7 | Cascade connection mode |

FIG. 7

| DIR | Input-output direction of data signal | Input-output direction of clock signal, etc. |
|---|---|---|
| L | VOUTx1 → VOUTx180 (x = A to D) | CLKnA → CLKnB<br>STVnA → STVnB<br>LSHIFTnA → LSHIFTnB<br>(n = 1 to 4) |
| H | VOUTx180 → VOUTx1 (x = A to D) | CLKnB → CLKnA<br>STVnB → STVnA<br>LSHIFTnB → LSHIFTnA<br>(n = 1 to 4) |

GATE DRIVE INTEGRATED CIRCUIT USED IN IMAGE DISPLAY DEVICE, IMAGE DISPLAY DEVICE, AND ORGANIC EL DISPLAY

TECHNICAL FIELD

The present disclosure relates to a gate drive integrated circuit used in an image display device, an image display device, and an organic electroluminescent (EL) display.

BACKGROUND ART

Image display panels in which pixel circuits having electroluminescent (EL) elements are arranged in a matrix and image display devices (hereafter referred to as "organic EL displays" as appropriate) using such image display panels have been commercialized in recent years.

An EL element emits light when a current flows through a light emitting layer formed between an anode electrode and a cathode electrode. Each pixel circuit includes a plurality of transistors. A plurality of types of gate signal lines for controlling the transistors of each pixel circuit are formed in the image display panel.

The gate signal lines are each connected to a chip on film (COF) that includes a gate drive integrated circuit (hereafter referred to as "gate driver IC" as appropriate) for driving the gate signal line. The COF generates a gate signal line voltage using a voltage from a predetermined power source and applies the gate signal line voltage to the gate signal line, according to an instruction from a timing controller (TCON).

CITATION LIST

Patent Literature

[PTL 1]
Japanese Unexamined Patent Application Publication No. 2007-188078

SUMMARY OF INVENTION

Technical Problem

The gate drive integrated circuit which is a structural component of organic EL displays is desired to have improved versatility, in terms of manufacturing cost.

The present disclosure has been made to solve the above-mentioned problem, and has an object of providing a gate drive integrated circuit used in an image display device, image display device, and organic EL display that can reduce manufacturing cost.

Solution to Problem

To achieve the object stated above, a gate drive integrated circuit used in an image display device according to an aspect of the present disclosure includes: a pair of signal terminals to and from which a predetermined signal is input and output; a signal direction control circuit that includes a buffer located between the pair of signal terminals, and controls an input-output direction of the predetermined signal; a connection mode control terminal that receives a connection mode control signal; and a pair of signal direction control terminals that receive a signal direction control signal, wherein the signal direction control circuit fixes the input-output direction of the predetermined signal to one direction in the case where a logic state of the connection mode control signal is a first logic state, and switches the input-output direction of the predetermined signal depending on a logic state of the signal direction control signal in the case where the logic state of the connection mode control signal is a second logic state different from the first logic state.

Advantageous Effects of Invention

A gate drive integrated circuit used in an image display device, image display device, and organic EL (electroluminescent) display according to the present disclosure can reduce manufacturing cost.

BRIEF DESCRIPTION OF DRAWINGS

FIG. 1A is a diagram illustrating an example of (part of) the structure of an organic EL display.

FIG. 6 is a table illustrating an example of the specifications of the gate driver IC in the embodiment.

FIG. 7 is a table illustrating an example of the specifications of the gate driver IC in the embodiment.

DESCRIPTION OF EMBODIMENTS

[Detailed Description of Problems]

Figure 1B:
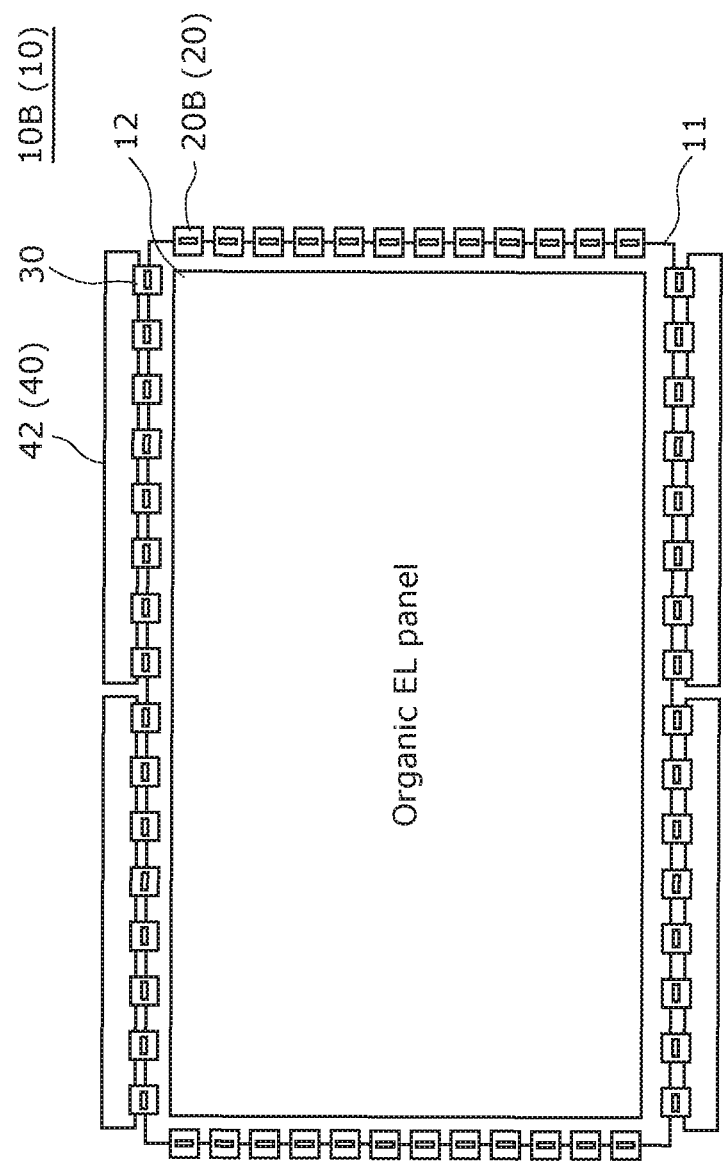
FIG. 1B is a diagram illustrating another example of (part of) the structure of the organic EL display.

FIGS. 1A and 1B are each a diagram illustrating an example of the structure of an organic EL display 10. FIGS. 1A and 1B each illustrate the structure of a display module without a housing, a TCON, etc.

An organic EL display 10A illustrated in FIG. 1A includes a glass substrate 11, an organic EL panel 12, a plurality of gate driver ICs 20A, a plurality of source drivers 30, and printed circuit boards (PCBs) 41 and 42.

The organic EL panel 12 is composed of a plurality of pixel circuits arranged in a matrix. The pixel circuits are formed on the glass substrate. Each pixel circuit includes an EL element which is a light emitting element, and a plurality of transistors. The plurality of transistors include, for example, a drive transistor for supplying a drive current to the EL element, and a selection transistor for selecting or not selecting the EL element.

The gate driver ICs 20A are each a COF including an integrated circuit that drives a plurality of gate signal lines connected to the gate terminals of the above-mentioned plurality of transistors. In other words, the gate driver ICs 20A each include an integrated circuit that applies, to each gate signal line, a voltage for turning ON or OFF the transistor connected to the gate signal line. The gate driver ICs 20A are connected to a plurality of gate signal lines formed on the glass substrate 11. Here, the gate driver ICs 20A are arranged on both sides of the organic EL panel, to drive the signal lines simultaneously from both sides.

The source drivers 30 each include an integrated circuit that applies, to a source signal line connected to the pixel circuit, a voltage corresponding to a pixel value. The source drivers 30 are connected to a plurality of source signal lines formed on the glass substrate 11. The PCB 41 includes a circuit that supplies signals from a TCON (not illustrated), to the gate driver ICs 20A. The PCB 41 is connected to the gate driver ICs 20A. The PCB 42 includes a circuit that supplies signals from the TCON (not illustrated), to the source drivers 30. The PCB 42 is connected to the source drivers 30. Two PCBs 42 are provided in FIG. 1A.

The number of gate driver ICs 20 and the number of PCBs 40 are set depending on the size of the organic EL display.

An organic EL display 10B illustrated in FIG. 1B includes the glass substrate 11, the organic EL panel 12, a plurality of gate driver ICs 20B, the plurality of source drivers 30, and the PCB 42. The organic EL display 10B differs from the organic EL display 10A in FIG. 1A in that it does not include the PCB 41.

Examples of the method of connecting the gate driver ICs 20, such as the method of routing clock signal lines for supplying clock signals, include (1) cascade connection and (2) multidrop connection. There are two types of gate driver ICs: gate driver ICs supporting cascade connection (for example, see Patent Literature (PTL) 1); and gate driver ICs supporting multidrop connection.

(1) In the cascade connection, each COF transfers a clock signal to its subsequent COF. The cascade connection thus reduces the number of cross wires, i.e. the number of wire intersections, or eliminates such cross wires. This enables single-layer wiring.

The cascade connection is used in an organic EL display without a PCB, such as the organic EL display 10B illustrated in FIG. 1B. The absence of the PCB is advantageous in making the organic EL display thinner. In detail, without the PCB, clock wiring for transferring clock signals input to the COFs needs to be formed on the glass substrate where the organic EL panel is provided. Since cross wiring cannot be performed on the glass substrate, it is necessary to cascade-connect the COFs.

Figure 2A:
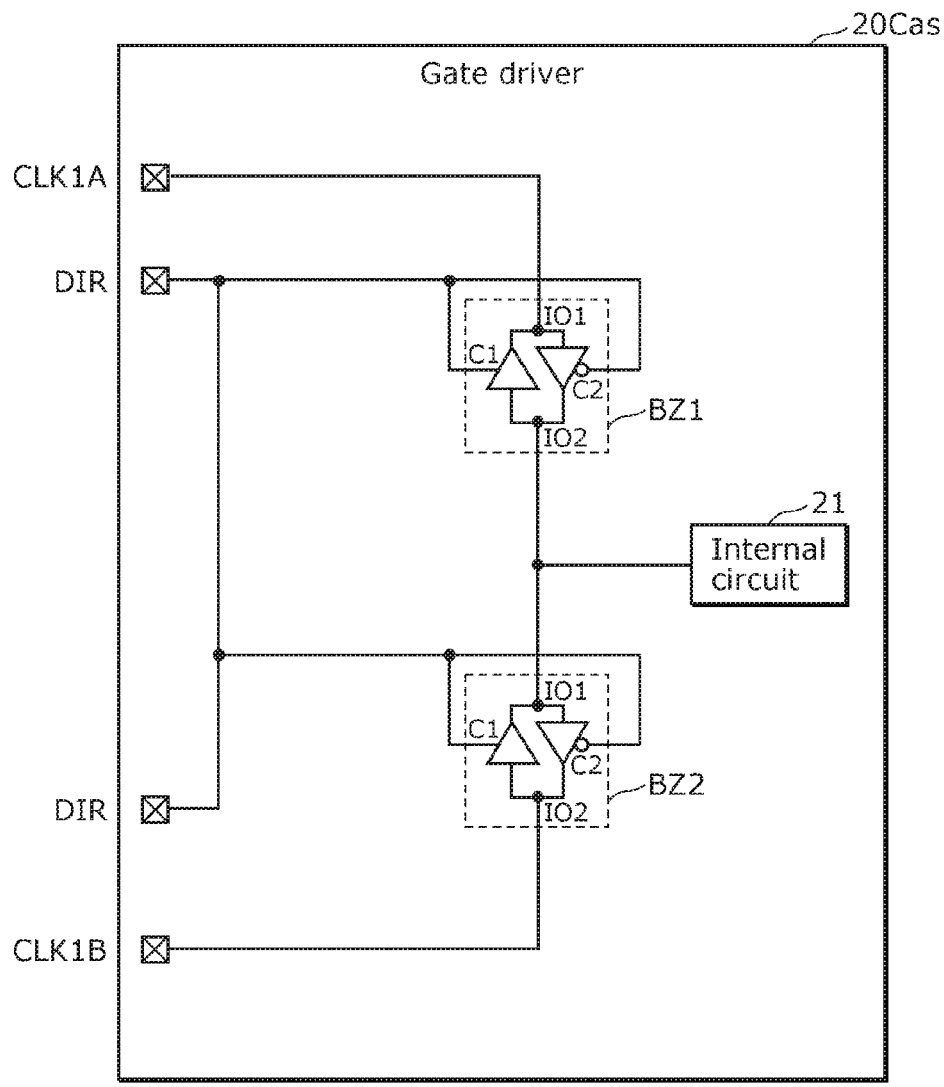
FIG. 2A is a diagram illustrating an example of a gate driver IC supporting cascade connection in a comparative example.

FIG. 2A is a diagram illustrating an example of a gate drive IC supporting cascade connection. FIG. 2A illustrates clock terminals CLK1A and CLK1B and a pair of signal direction control terminals DIR to which a signal indicating the direction of a clock signal is input while omitting other terminals, for the purpose of explanation.

A gate driver IC 20Cas illustrated in FIG. 2A ("gate driver" in FIG. 2A) includes bidirectional buffers BZ1 and BZ2 and an internal circuit 21.

The bidirectional buffer BZ1 is an example of a signal direction control circuit, and includes a combination of two 3-state buffers (buffers with control inputs). In detail, the bidirectional buffer BZ1 is formed by connecting the two 3-state buffers in parallel so that their input-output directions are opposite to each other. One of the two 3-state buffers outputs a signal of the same logic state as the input signal in the case where the input signal is H level, and outputs Hi-Z in the case where the input signal is L level. The other one of the two 3-state buffers outputs a signal of the same logic state as the input signal in the case where the input signal is L level, and outputs Hi-Z in the case where the input signal is H level. Here, each 3-state buffer is a clock buffer. The clock buffer is a buffer that can be used for a clock signal. The clock buffer may be a buffer having features such as low delay and support for high-speed operation. The bidirectional buffer BZ1 is located between the clock terminal CLK1A and the internal circuit 21. The bidirectional buffer BZ1 has switch terminals C1 and C2 connected to the pair of signal direction control terminals DIR, a terminal IO1 connected to the clock terminal CLK1A, and a terminal IO2 connected to the terminal IO1 of the bidirectional buffer BZ2 and the internal circuit 21.

The bidirectional buffer BZ2 includes a combination of two 3-state buffers, as with the bidirectional buffer BZ1. In detail, the bidirectional buffer BZ2 is formed by connecting the two 3-state buffers in parallel so that their input-output directions are opposite to each other. The bidirectional buffer 13Z2 is located between the clock terminal CLK1B and the internal circuit 21. The bidirectional buffer BZ2 has switch terminals C1 and C2 connected to the pair of signal direction control terminals DIR, a terminal IO1 connected to the terminal IO2 of the bidirectional buffer BZ1 and the internal circuit 21, and a terminal IO2 connected to the clock terminal CLK1B.

The internal circuit 21 includes a shift register, an output circuit, etc.

In the gate driver IC 20Cas illustrated in FIG. 2A, in the case where a signal direction control signal input to the pair of signal direction control terminals DIR is L level, the input-output direction of the clock signal is the direction from the clock terminal CLK1A to the clock terminal CLK1B (first direction). In the case where the signal direction control signal is H level, the input-output direction of the clock signal is the direction from the clock terminal CLK1B to the clock terminal CLK1A (second direction).

(2) In the multidrop connection, clock wiring for supplying clock signals to all COFs is formed on a PCB, and each COF receives a clock signal directly from such clock wiring. The multidrop connection has no clock signal delay, and so is advantageous in increasing the resolution of the organic EL display. The multidrop connection can be used in both the organic EL display 10A in FIG. 1A and the organic EL display 10B in FIG. 1B.

Figure 2B:
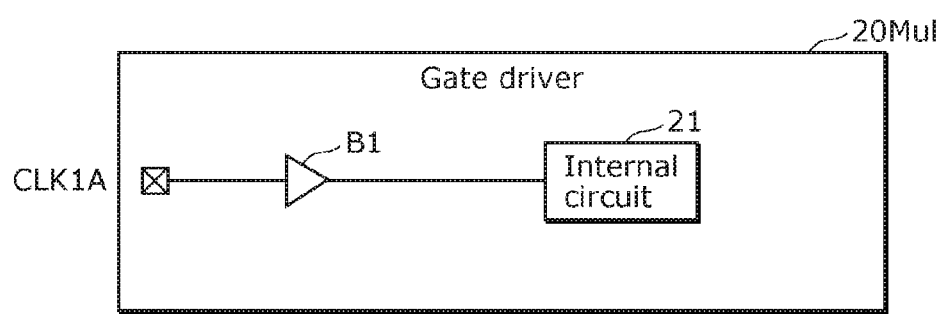
FIG. 2B is a diagram illustrating an example of a gate driver IC supporting multidrop connection in a comparative example.

FIG. 2B is a diagram illustrating an example of a gate driver IC supporting multidrop connection. FIG. 2B illustrates a clock terminal CLK1A and a buffer B1 while omitting other terminals, for the purpose of explanation.

A gate driver IC 20Mul illustrated in FIG. 2B ("gate driver" in FIG. 2B) supplies a signal input to the clock terminal CLK1A, to the internal circuit 21 via the buffer B1. Since the multidrop connection does not require control of the signal transfer to the subsequent stage and the signal direction, the clock terminal CLK1B and the pair of signal direction control terminals DIR as a function of controlling the direction of the clock signal are unnecessary.

In organic EL displays, the number of gate signal lines per pixel circuit is large, i.e. 4 or more. The structure of the gate driver IC therefore tends to be complex. Hence, an IC specifically supporting cascade connection and an IC specifically supporting multidrop connection are selectively used depending on the size, application, etc. of the organic EL display in which the gate driver IC is to be mounted.

A gate drive integrated circuit having improved versatility, i.e. supporting both cascade connection and multidrop connection, is desired in terms of manufacturing cost, as mentioned earlier.

Embodiment

The following describes an embodiment in detail with reference to drawings as appropriate. In the following, description detailed more than necessary may be omitted. For example, detailed description of well-known matters or repeated description of the substantially same structures may be omitted. This is to avoid unnecessarily redundant description and facilitate the understanding of a person skilled in the art.

The accompanying drawings and the following description are provided to help a person skilled in the art to fully understand the present disclosure, and are not intended to limit the subject matter defined in the appended claims.

The drawings are not necessarily in precise dimensions or dimensional ratios.

The embodiment described below shows a preferable specific example of the present disclosure. The numerical values, shapes, materials, structural elements, the arrangement and connection of the structural elements, steps, the processing order of the steps etc. shown in the following embodiment are mere examples, and do not limit the scope of the present disclosure. The present disclosure is defined by the claims. Of the structural elements in the embodiment described below, the structural elements not recited in any one of the independent claims are not necessarily required in order to achieve the object of the present disclosure but are described as constituting preferable embodiments.

A gate driver IC and an organic EL display using the gate driver IC in the embodiment are described below, with reference to FIGS. 3 to 11.

The gate driver IC in this embodiment supports both cascade connection and multidrop connection, while the gate driver IC in the comparative example supports only one of cascade connection and multidrop connection. The gate driver IC in this embodiment accordingly includes a connection mode control terminal CLKSEL for switching between cascade connection and multidrop connection. Although two terminals are paired as the connection mode control terminal CLKSEL in this embodiment, one terminal may be used as the connection mode control terminal CLKSEL.

Figure 11:
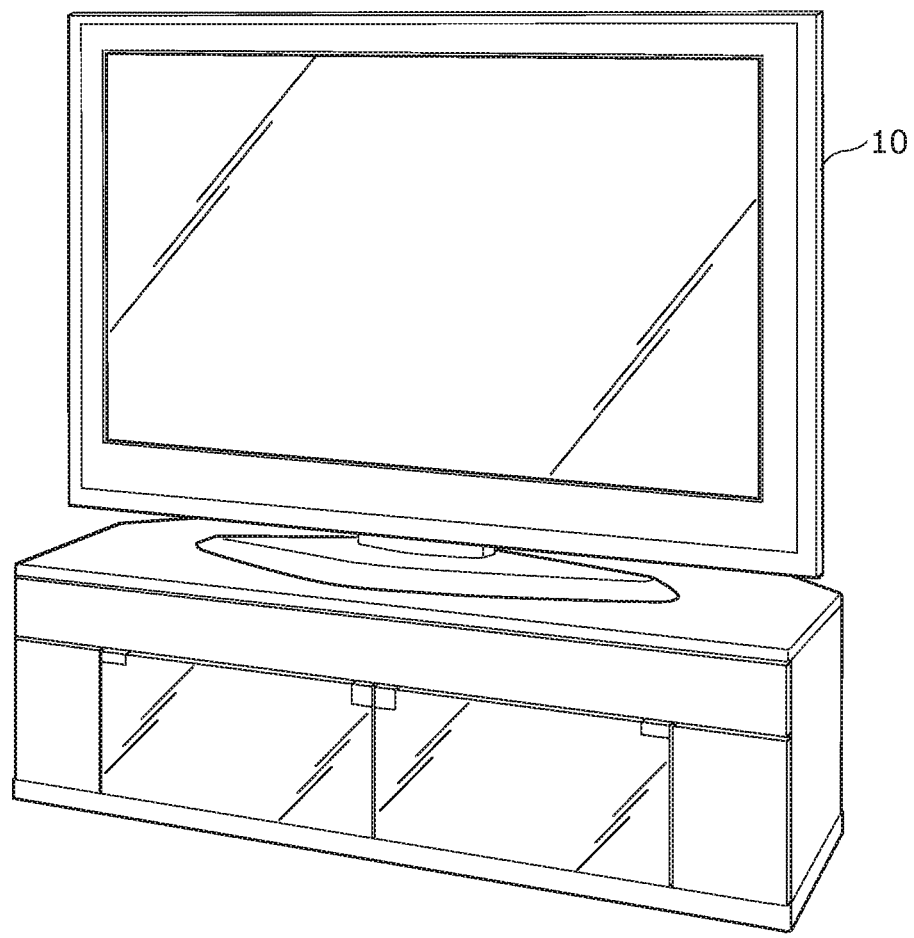
FIG. 11 is a diagram illustrating an example of the appearance of an organic EL display using the gate driver IC in the embodiment.

FIG. 11 is an appearance diagram illustrating an example of the appearance of the organic EL display using the gate driver IC in this embodiment. The organic EL display is an example of an image display device.

[1. Structure of Gate Driver IC]

Figure 3:
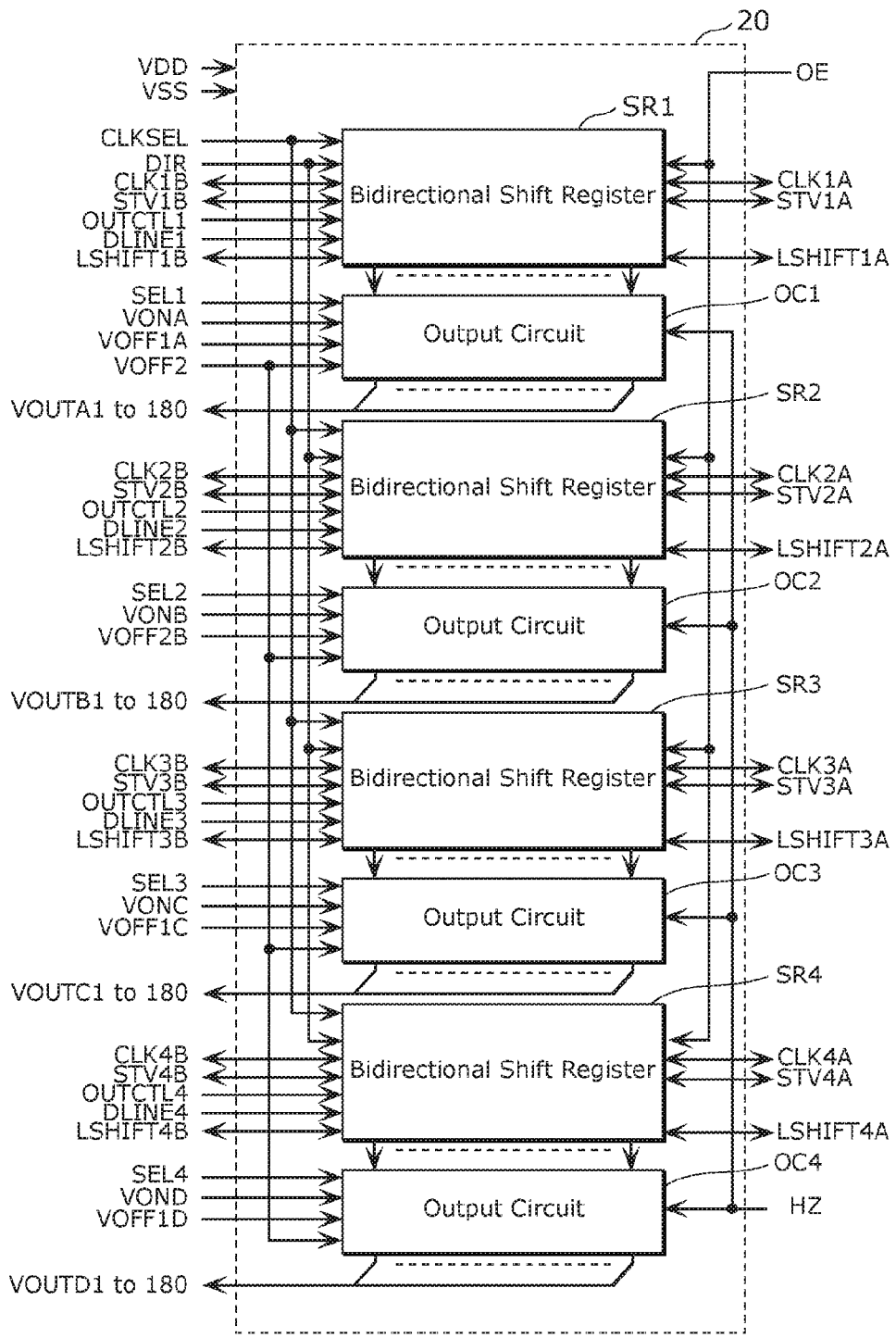
FIG. 3 is a circuit diagram illustrating an example of the structure of a gate driver IC in an embodiment.
Figure 4:
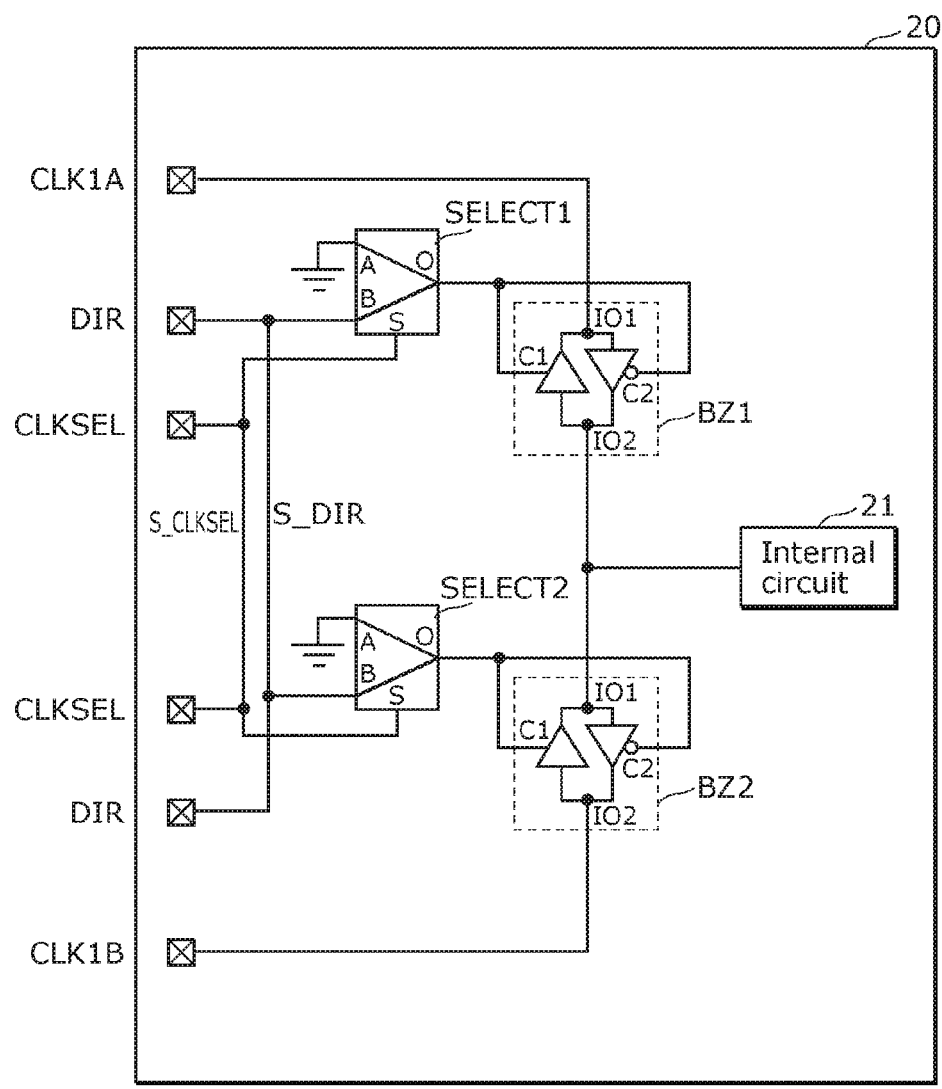
FIG. 4 is a circuit diagram illustrating an example of the structure of the gate driver IC in the embodiment.

FIGS. 3 and 4 are each a circuit diagram illustrating an example of the structure of a gate driver IC 20. FIG. 3 illustrates the overall block structure of the gate driver IC 20.

FIG. 3 illustrates an example where the gate driver IC 20 receives four types of clock signals. The gate driver IC 20 illustrated in FIG. 3 includes a shift register SRj (j=1 to 4 in FIG. 3) and an output circuit OCj corresponding to each of the four types of clock signals. Although FIG. 3 illustrates the case where the gate driver IC 20 includes four shift registers SRj and four output circuits OCj, this is not a limitation, as long as the gate driver IC 20 includes the number of shift registers and the number of output circuits corresponding to the number of types of clock signals, that is, the number of transistors per pixel circuit.

The shift register SRj is a bidirectional register, and is connected to a node to which a connection mode control signal S_CLKSEL is transmitted, a node to which a signal direction control signal S_DIR is transmitted, clock terminals CLKjA and CLKjB, terminals STVjA and STVjB, terminals LSHIFTjA and LSHIFTjB, a terminal OUTCTLj, a terminal DLINEj, and the output circuit OCj. The node to which the connection mode control signal S_CLKSEL is transmitted is a node to which a connection mode control terminal CLKSEL is connected (see FIG. 4). The node to which the signal direction control signal S_DIR is transmitted is a node to which a pair of signal direction control terminals S_DIR are connected (see FIG. 4).

The output circuit OCj is connected to a terminal SELj, a terminal VONk, a terminal VOFF1k, a terminal VOFF2, terminals VOUTk1 to 180, and a terminal HZ. Here, k=A when j=1, k=B when j=2, k=C when j=3, and k=D when j=4.

FIG. 4 illustrates the part of the structure of the gate driver IC 20 relating to one type of clock signal input to the clock terminal CLK1A or CLK1B, to indicate the difference from the comparative example. The same circuit as the circuit corresponding to the clock signal input to the clock terminal CLK1A or CLK1B is used for the other clock signals (clock signals input to the clock terminal CLK2A or CLK2B to the clock terminal CLKnA or CLKnB).

Figure 5:
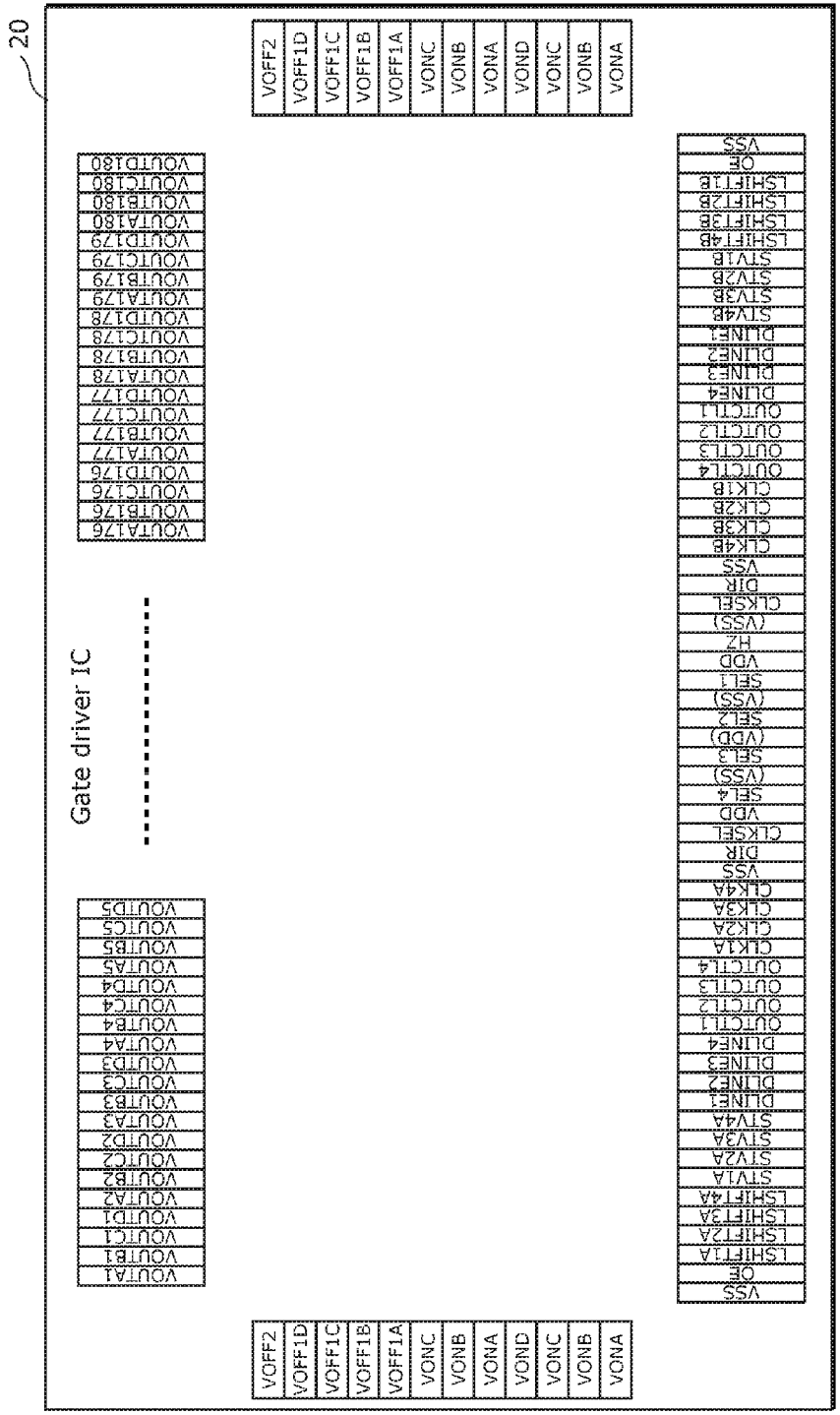
FIG. 5 is a diagram illustrating an example of the arrangement of terminals in the gate driver IC in the embodiment.

FIG. 5 is a diagram illustrating an example of the arrangement of terminals in the gate driver IC 20.

The gate driver IC 20 includes a pair of signal terminals, a bidirectional buffer, a connection mode control terminal, a pair of signal direction control terminals, and a control mode switch circuit, as illustrated in FIG. 4. In this embodiment, a pair of terminals, i.e. one terminal on the input side and the other terminal on the output side, are provided for each signal except a power terminal to which power is input, in order to support cascade connection. Each terminal includes a bidirectional IO buffer to correspond to both the input side and the output side.

The pair of signal terminals are each a terminal to or from which a predetermined signal is input or output. This embodiment describes the clock terminals CLK1A and CLK1B to and from which a clock signal is input and output, as an example.

The bidirectional buffer is located between the clock terminals CLK1A and CLK1B, and includes a switch terminal for switching the input-output direction of the clock terminals CLK1A and CLK1B. In this embodiment, two bidirectional buffers BZ1 and BZ2 are provided.

The bidirectional buffer BZ1 is located between the clock terminal CLK1A and an internal circuit 21. The bidirectional buffer BZ1 has switch terminals C1 and C2 connected to the output terminal O of the below-mentioned selector SELECT1, a terminal IO1 connected to the clock terminal CLK1A, and a terminal IO2 connected to the terminal IO1 of the bidirectional buffer BZ2 and the internal circuit 21.

The bidirectional buffer BZ2 is located between the clock terminal CLK1B and the internal circuit 21. The bidirectional buffer BZ2 has switch terminals C1 and C2 connected to the output terminal of the below-mentioned selector SELECT2, a terminal IO1 connected to the terminal IO2 of the bidirectional buffer BZ1 and the internal circuit 21, and a terminal IO2 connected to the clock terminal CLK1B.

The connection mode control terminal CLKSEL is a terminal to or from which the connection mode control signal S_CLKSEL is input or output.

Whether the input-output direction of the clock signal is fixed (multidrop connection) or variable (cascade connection) is selected depending on the logic state of the connection mode control signal S_CLKSEL.

The pair of signal direction control terminals DIR are each a terminal to or from which the signal direction control signal S_DIR is input or output in the case where cascade connection is selected.

The control mode switch circuit supplies, to the switch terminals of the bidirectional buffer, a signal for fixing the input-output direction of the clock signal to one direction in the case where the logic state of the connection mode control signal is a first logic state, and supplies, to the switch terminals of the bidirectional buffer, a signal corresponding to the logic state of the signal direction control signal in the case where the logic state of the connection mode control signal is a second logic state.

The control mode switch circuit includes the selectors SELECT1 and SELECT2 in this embodiment.

The selector SELECT1 has a terminal S connected to the connection mode control terminal CLKSEL, a terminal B connected to the pair of signal direction control terminals DIR, and a terminal A to which a signal of L level is input. The selector SELECT1 also has an output terminal O connected to the switch terminals C1 and C2 of the bidirectional buffer BZ1.

The selector SELECT2 has a terminal S connected to the connection mode control terminal CLKSEL, a terminal B connected to the pair of signal direction control terminals DIR, and a terminal A to which a signal of L level is input. The selector SELECT2 also has an output terminal O connected to the switch terminals C1 and C2 of the bidirectional buffer BZ2.

FIG. 5 is a diagram illustrating an example e of the arrangement of terminals in the gate driver IC 20.

The pair of signal direction control terminals DIR are located between the clock terminals CLKnA and CLKnB (n=the number of types of clock), and the connection mode control terminal CLKSEL is located between the pair of signal direction control terminals DIR. The terminals whose terminal names has the index "A" are on the left side of the drawing, and the terminals whose terminal names has the index "B" are on the right side of the drawing.

Although FIG. 5 illustrates the case where the number n of types of clock signals is 4, n is set depending on the structure of the pixel circuit, in particular the number of transistors in the pixel circuit.

[2. Specifications and Operation of Gate Driver IC]

FIGS. 6 and 7 are each a table illustrating an example of the specifications of the gate driver IC 20 in this embodiment.

FIG. 6 illustrates the relationship between the logic state of the connection mode control signal S_CLKSEL input to the connection mode control terminal CLKSEL and the input-output direction of the clock signal.

FIG. 7 illustrates the relationship between the logic state of the signal direction control signal S_DIR input to the pair of signal direction control terminals DIR and the input-output direction of each signal. In the case where CLKSEL is L level, the input-output direction of the clock signal does not depend on the signal direction control terminals DIR (i.e. not according to the table in FIG. 7) and is fixed to the first direction in which the clock terminal CLK1A is the input and the clock terminal CLK1B is the output, as illustrated in FIG. 6. In other words, regarding the terminals STV and LSHIFT, the input-output direction of the signal is set not depending on the connection mode control signal S_CLKSEL but depending on the signal direction control signal S_DIR.

In the case where the connection mode control signal S_CLKSEL is L level (corresponding to the first logic state, e.g. ground voltage), the connection mode is the multidrop connection mode, as illustrated in FIG. 6. The input-output direction of the clock signal in this case is fixed to the first direction from the clock terminal CLK1A to the clock terminal CLK1B.

In the case where the connection mode control signal S_CLKSEL is H level (corresponding to the second logic state, e.g. power voltage), the connection mode is the cascade connection mode, as illustrated in FIG. 6. The input-output direction of the clock signal in this case is set depending on the logic state of the signal direction control signal S_DIR. In detail, in the case where the signal direction control signal S_DIR is L level (corresponding to a third logic state), the input-output direction of the signal is set to the first direction. In the case where the signal direction control signal S_DIR is H level (corresponding to a fourth logic state), the input-output direction of the signal is set to the second direction.

The first direction and the second direction may be reversed. The connection mode may be the multidrop connection mode in the case where the connection mode control signal S_CLKSEL is H level, and the cascade connection mode in the case where the connection mode control signal S_CLKSEL is L level. The signal direction may be set to the first direction in the case where the signal direction control signal S_DIR is H level, and the second direction in the case where the signal direction control signal S_DIR is L level.

[3. Examples of Connecting Gate Driver ICs (Structure of Organic EL Display)]

Examples of connecting gate driver ICs are described below, with reference to FIGS. 8 to 10. The following describes the case of cascade connection (without a PCB), the case of cascade connection (with a PCB), and the case of multidrop connection (with a PCB).

[3-1. Connection Example 1: Cascade Connection (without PCB)]

Figure 8:
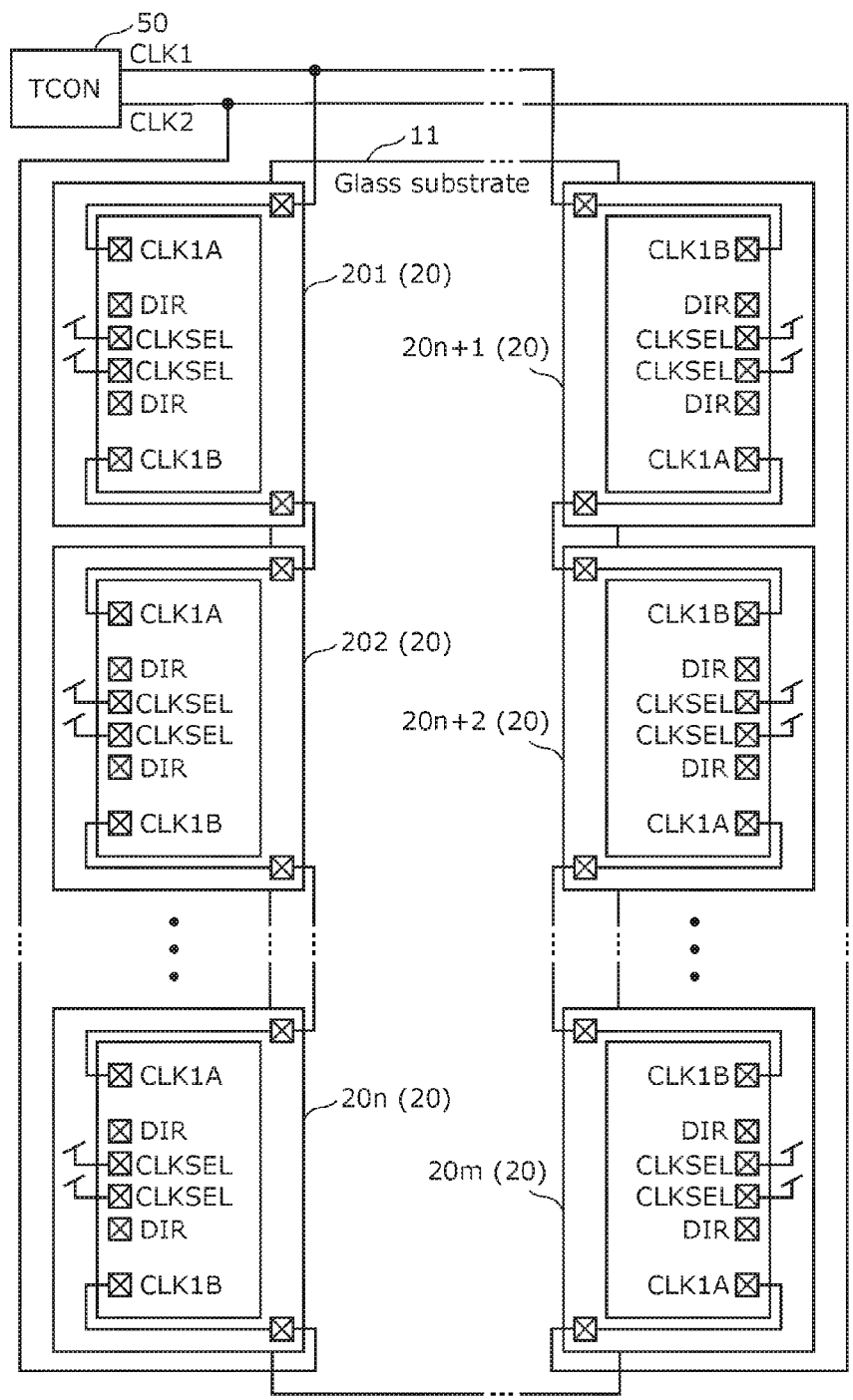
FIG. 8 is a circuit diagram illustrating an example of connecting gate driver ICs in the embodiment.

FIG. 8 is a circuit diagram illustrating a connection example in the case of cascade connection in the organic EL display 10B without the PCB 41 (see FIG. 1B).

The structure of the organic EL display 10B is the same as that in the comparative example, except the gate driver IC and the wiring for connecting the gate driver IC and the TCON.

In this connection example illustrated in FIG. 8, gate driver ICs 201 to 20n are connected in a line at the left end of the glass substrate 11, and gate driver ICs 20n+1 to 20m (m=2n) are connected in a line at the right end of the glass substrate 11.

On the left side of the glass substrate 11, the clock terminal CLK1B of the gate driver IC 20h (h=1 to n−1) and the clock terminal CLK1A of the gate driver IC 20h+1 are connected to each other, as illustrated in FIG. 8.

On the right side of the glass substrate 11, the gate driver ICs 20n+1 to 20m (m=2n) are positioned so as to be reversed up and down and right and left from the gate driver ICs 201 to 20n, as illustrated in FIG. 8. On the right side of the glass substrate 11, the clock terminal CLK1A of the gate driver IC 20i (i=n+1 to m−1) and the clock terminal CLK1B of the gate driver IC 20i+1 are connected to each other, as illustrated in FIG. 8.

The wiring for connecting the gate driver ICs 20 to each other is formed on the glass substrate 11.

The connection mode control terminal CLKSEL and the pair of signal direction control terminals DIR are cascade-connected by the same method as the clock terminals, though not illustrated.

In an actual product, the connection mode control signal S_CLKSEL input to the connection mode control terminal CLKSEL is fixed. In this connection example, the cascade connection is selected, so that the connection mode control terminal CLKSEL is connected to power wiring.

The TCON 50 outputs a signal of L level to the pair of signal direction control terminals DIR and outputs the clock signal CLK1 to the clock terminal CLK1A of each of the gate driver ICs 20 $_1$ and 20 $m$, in the case of setting the input-output direction of the signal to the first direction. The TCON 50 outputs a signal of H level to the pair of signal direction control terminals DIR and outputs the clock signal CLK2 to the clock terminal CLK1B of each of the gate driver ICs 20$n$ and 20$n$+1, in the case of setting the input-output direction of the signal to the second direction.

[3-2. Connection Example 2: Cascade Connection (with PCB)]

Figure 9:
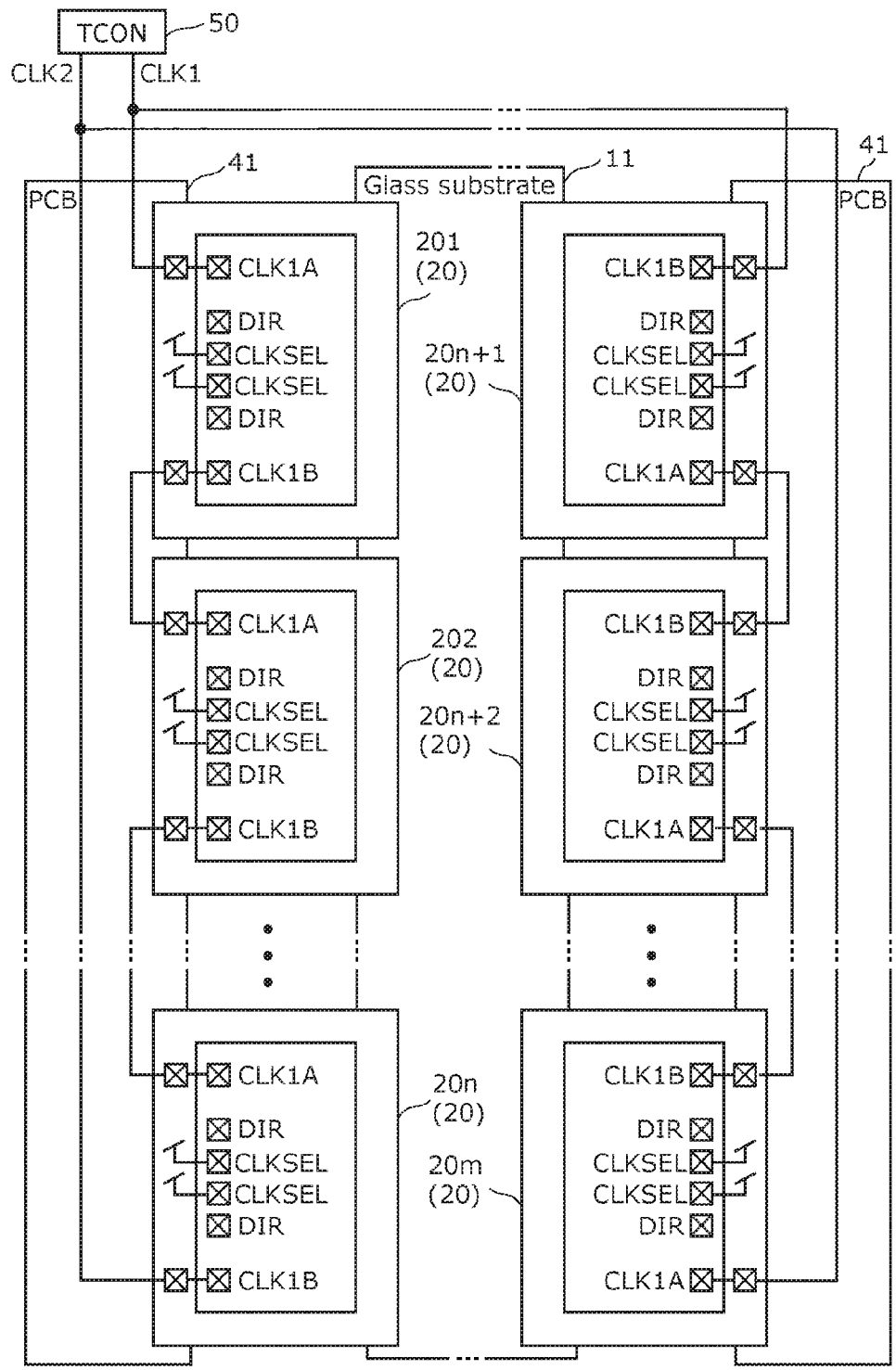
FIG. 9 is a circuit diagram illustrating an example of connecting gate driver ICs in the embodiment.

FIG. 9 is a circuit diagram illustrating a connection example in the case of cascade connection in the organic EL display 10A with the PCB 41 (see FIG. 1A).

The structure of the organic EL display 10A is the same as that in the comparative example, except the gate driver IC and the wiring for connecting the gate driver IC and the TCON.

In this connection example illustrated in FIG. 9, gate driver ICs 20 $_1$ to 20$n$ are connected in a line at the left end of the glass substrate 11, and the PCB 41 and the gate driver ICs 20 $_1$ to 20$n$ are connected on the left side of the gate driver ICs 20 $_1$ to 20$n$ in the drawing. Moreover, gate driver ICs 20$n$+1 to 20$m$ (m=2n) are connected in a line at the right end of the glass substrate 11, and the PCB 41 and the gate driver ICs 20$n$+1 to 20$m$ are connected on the right side of the gate driver ICs 20$n$+1 to 20$m$ in the drawing.

On the left side of the glass substrate 11, the clock terminal CLK1B of the gate driver IC 20$h$ (h=1 to n−1) and the clock terminal CLK1A of the gate driver IC 20$h$+1 are connected to each other, as in the connection example 1.

On the right side of the glass substrate 11, the gate driver ICs 20$n$+1 to 20$m$ (m=2n) are positioned so as to be reversed up and down and right and left from the gate driver ICs 20 $_1$ to 20$n$, as in the connection example 1. On the right side of the glass substrate 11, the clock terminal CLK1A of the gate driver IC 20$i$ (i=n+1 to m−1) and the clock terminal CLK1B of the gate driver IC 20$i$+1 are connected to each other, as in the connection example 1.

The wiring for connecting the gate driver ICs 20 to each other is formed on the PCB 41 in this connection example.

The connection mode control terminal CLKSEL and the pair of signal direction control terminals DIR are cascade-connected by the same method as the clock terminals, though not illustrated.

In an actual product, the connection mode control signal S_CLKSEL input to the connection mode control terminal CLKSEL is fixed. In this connection example, the cascade connection is selected, so that the connection mode control terminal CLKSEL is connected to power wiring.

The TCON 50 outputs a signal of L level to the pair of signal direction control terminals DIR and outputs the clock signal CLK1 to the clock terminal CLK1A of each of the gate driver ICs 20 $_1$ and 20$m$ in the case of setting the input-output direction of the signal to the first direction, as in the connection example 1. The TCON 50 outputs a signal of H level to the pair of signal direction control terminals DIR and outputs the clock signal CLK2 to the clock terminal CLK1B of each of the gate driver ICs 20$n$ and 20$n$+1 in the case of setting the input-output direction of the signal to the second direction, as in the connection example 1.

[3-3. Connection Example 3: Multidrop Connection (with PCB)]

Figure 10:
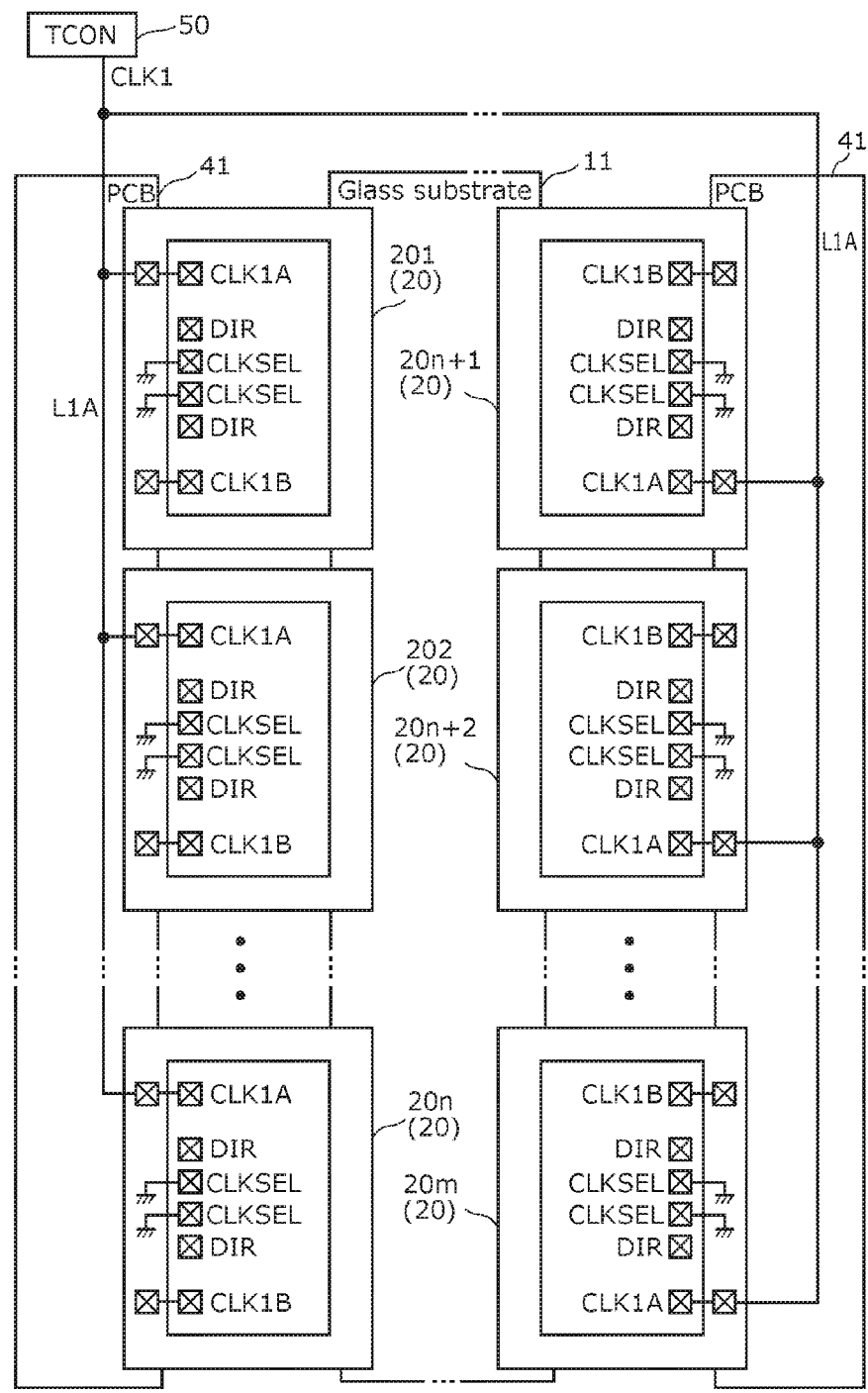
FIG. 10 is a circuit diagram illustrating an example of connecting gate driver ICs in the embodiment.

FIG. 10 is a circuit diagram illustrating a connection example in the case of multidrop connection in the organic EL display 10A with the PCB 41 (see FIG. 1A).

The structure of the organic EL display 10A is the same as that in the comparative example, except the gate driver IC and the wiring for connecting the gate driver IC and the TCON.

In this connection example as in the connection example 2, gate driver ICs 20 $_1$ to 20$n$ are connected in a line at the left end of the glass substrate 11, and the PCB 41 and the gate driver ICs 20 $_1$ to 20$n$ are connected on the left side of the gate driver ICs 20 $_1$ to 20$n$ in the drawing. Moreover, gate driver ICs 20$n$+1 to 20$m$ (m=2n) are connected in a line at the right end of the glass substrate 11, and the PCB 41 and the gate driver ICs 20$n$+1 to 20$m$ are connected on the right side of the gate driver ICs 20$n$+1 to 20$m$ in the drawing.

The clock terminal CLK1A of each of the gate driver ICs 20 $_1$ to 20$m$ is connected to clock wiring L1A formed on the PCB 41, and the clock terminal CLK1B of each of the gate driver ICs 20 $_1$ to 20$m$ is connected to clock wiring L1B formed on the PCB 41.

The connection mode control terminal CLKSEL and the pair of signal direction control terminals DIR are multidrop-connected by the same method as the clock terminals, though not illustrated.

In an actual product, the connection mode control signal S_CLKSEL input to the connection mode control terminal CLKSEL is fixed. In this connection example, the multidrop connection is selected, so that the connection mode control terminal CLKSEL is connected to ground wiring.

In this connection example, the input-output direction of the signal is fixed to the first direction regardless of the voltage of the pair of signal direction control terminals DIR. Accordingly, the TCON 50 does not need to switch the voltage of the pair of signal direction control terminals DIR.

[4. Regarding Signals Other than Clock Signal]

Although this embodiment describes the clock signal, it is desirable to support both cascade connection and multidrop connection for a gate signal supplied to each of the gate terminals of the plurality of transistors included in the pixel circuit, too.

Regarding a signal such as a gate signal, a buffer provided between a pair of signal terminals may not be a bidirectional clock buffer, as long as it has suitable drive capability according to the application of the signal, etc.

In the connection example using the PCB 41 in the section 3-2 or 3-3, multidrop connection may be used for any signal that needs to be synchronized, such as a clock signal, while using cascade connection for other signals.

[5. Operations and Effects]

The gate driver IC in this embodiment supports both cascade connection and multidrop connection, and thus has improved versatility. Such improved versatility of the gate driver IC can reduce manufacturing cost, as compared with the case of separately producing two types of gate driver ICs. An image display device such as an organic EL display using the gate driver IC can be manufactured at lower cost.

In the case of cascade connection, the input-output direction of the signal can be controlled by the signal direction control signal input to the pair of signal direction control terminals DIR.

The gate driver IC in this embodiment has the pair of signal direction control terminals between the pair of signal terminals for receiving a predetermined signal such as a clock signal or a gate signal, and has the connection mode control terminal between the pair of signal direction control terminals. This eases wiring in the cascade connection mode.

In the gate driver IC in this embodiment, a simple and small structural change of providing the connection mode control terminal for receiving the connection mode control signal S_CLKSEL enables switching between cascade connection and multidrop connection. This prevents complex wiring between the TCON and the gate driver ICs. In particular, an organic EL display has a large number of transistors in each pixel circuit and tends to have complex wiring and the like, as compared with other image display devices such as a liquid crystal display (see FIG. 3). Therefore, making the structural change of the gate driver IC simple and small is especially advantageous in organic EL displays.

Moreover, since the clock signal significantly affects the operation of the organic EL display 10, versatility can be further improved by enabling selection between cascade connection and multidrop connection for the clock signal.

Other Embodiments, Etc.

Although the embodiment has been described above to illustrate the disclosed technology, the disclosed technology is not limited to such. Changes, replacements, additions, omissions, etc. may be made to the embodiment as appropriate, and structural elements described in the embodiment may be combined as a new embodiment.

(1) For example, although a bidirectional buffer is used as the signal direction control circuit that sets the input-output direction of the signal in the foregoing embodiment, this is not a limitation. A 3-state buffer may be directly used, or a buffer circuit formed by combining other logic circuits may be used.

(2) Although a selector is used as the structure for switching the connection mode in the foregoing embodiment, this is not a limitation.

(3) Although the foregoing embodiment describes an example of including two connection mode control terminals CLKSEL, this is not a limitation. The number of connection mode control terminals may be 1, particularly in the case of connecting it to power wiring.

The foregoing embodiment is described to illustrate the disclosed technology, through the detailed description and the accompanying drawings.

The structural elements in the detailed description and the accompanying drawings may include not only the structural elements essential for the solution of the problem but also the structural elements not essential for the solution of the problem, to illustrate the disclosed technology. The inclusion of such optional structural elements in the detailed description and the accompanying drawings therefore does not mean that these optional structural elements are essential structural elements.

The foregoing embodiment is intended to be illustrative of the disclosed technology, and so various changes, replacements, additions, omissions, etc. can be made within the scope of the appended claims and their equivalents.

INDUSTRIAL APPLICABILITY

The present disclosure is useful for a gate drive integrated circuit and an image display device using the gate drive integrated circuit, in particular an organic EL display.

REFERENCE SIGNS LIST 10, 10A, 10B organic EL display
11 glass substrate
12 organic EL panel
20, 20A, 20B, 201, 20n, 20i, 20h, 20Cas, 20Mul gate driver IC
21 internal circuit
30 source driver
40, 41, 42 PCB
50 TCON
B1 buffer
BZ1, BZ2 bidirectional buffer
CLK1, CLK2 clock signal
CLK1A, CLK1B, CLK2A, CLKnA, CLKjA clock terminal
S_CLKSEL control mode control signal
CLKSEL connection mode control terminal
S_DIR signal direction control signal
DIR signal direction control terminal
L1A, L1B clock wiring
SELECT1, SELECT2 selector

The invention claimed is:

1. A gate drive integrated circuit used in an image display device, the gate drive integrated circuit comprising:
   a pair of signal terminals to and from which a predetermined signal is input and output;
   a signal direction control circuit that includes a buffer located between the pair of signal terminals, and controls an input-output direction of the predetermined signal;
   a connection mode control terminal that receives a connection mode control signal; and
   a pair of signal direction control terminals that receive a signal direction control signal,
   wherein the signal direction control circuit fixes the input-output direction of the predetermined signal to one direction in the case where a logic state of the connection mode control signal is a first logic state, and switches the input-output direction of the predetermined signal depending on a logic state of the signal direction control signal in the case where the logic state of the connection mode control signal is a second logic state different from the first logic state.

2. The gate drive integrated circuit used in an image display device according to claim 1,
   wherein in the case where the logic state of the connection mode control signal is the second logic state, the signal direction control circuit:
   sets the input-output direction of the predetermined signal to a first direction in the case where the logic state of the signal direction control signal is a third logic state; and
   sets the input-output direction of the predetermined signal to a second direction different from the first direction in the case where the logic state of the signal direction control signal is a fourth logic state different from the third logic state.

3. The gate drive integrated circuit used in an image display device according to claim 1,
wherein the pair of signal direction control terminals and the connection mode control terminal are located between the pair of signal terminals.

4. The gate drive integrated circuit used in an image display device according to claim 3,
wherein the connection mode control terminal is located between the pair of signal direction control terminals.

5. The gate drive integrated circuit used in an image display device according to claim 1,
wherein the predetermined signal includes a plurality of signals,
the plurality of signals include a plurality of gate signals that are output to gate terminals of a plurality of transistors included in a pixel circuit including a light emitting element, and
the pair of signal terminals and the buffer are provided for each of the plurality of signals.

6. The gate drive integrated circuit used in an image display device according to claim 5,
wherein the plurality of signals include a clock signal.

7. The gate drive integrated circuit used in an image display device according to claim 1,
wherein the buffer in the signal direction control circuit is a bidirectional buffer with a control input,
a signal of a fixed level is input to the control input in the case where the logic state of the connection mode control signal is the first logic state, and
the signal direction control signal is input to the control input in the case where the logic state of the connection mode control signal is the second logic state.

8. An image display device comprising:
an image display device substrate on which a plurality of pixel circuits are formed, each of the plurality of pixel circuits including a light emitting element and a plurality of transistors;
a plurality of flexible cables each of which includes the gate drive integrated circuit used in an image display device according to claim 1; and
a printed board,
wherein the plurality of flexible cables are arranged in a line on a side of the image display device substrate,
each of the plurality of flexible cables has one end connected to the side of the image display device substrate, and an other end connected to the printed board,
one of the pair of signal terminals in each of the plurality of flexible cables is connected to wiring formed on the printed board, and
the connection mode control signal of the first logic state is input to the connection mode control terminal in each of the plurality of flexible cables.

9. An image display device comprising:
an image display device substrate on which a plurality of pixel circuits are formed, each of the plurality of pixel circuits including a light emitting element and a plurality of transistors; and
a plurality of flexible cables each of which includes the gate drive integrated circuit used in an image display device according to claim 1,
wherein the plurality of flexible cables are arranged in a line on a side of the image display device substrate,
one of the pair of signal terminals in each of the plurality of flexible cables is connected to an other one of the pair of signal terminals in an adjacent one of the plurality of flexible cables, and
the connection mode control signal of the second logic state is input to the connection mode control terminal in each of the plurality of flexible cables.

10. An organic EL display comprising:
an image display device substrate on which a plurality of pixel circuits are formed, each of the plurality of pixel circuits including an organic electroluminescent (EL) element and a plurality of transistors; and
a plurality of flexible cables each of which includes the gate drive integrated circuit used in an image display device according to claim 1,
wherein the plurality of flexible cables are connected in a line on a side of the image display device substrate.

* * * * *